US012699156B2

(12) United States Patent
Fischer

(10) Patent No.: US 12,699,156 B2
(45) Date of Patent: Aug. 4, 2026

(54) ARRANGEMENT AND METHOD FOR CALIBRATING HIGH-VOLTAGE ELECTRONICS

(71) Applicant: dSPACE GmbH, Paderborn (DE)

(72) Inventor: Manuel Fischer, Paderborn (DE)

(73) Assignee: dSPACE SE & Co. KG, Paderborn (DE)

( * ) Notice: Subject to any disclaimer, the term of this patent is extended or adjusted under 35 U.S.C. 154(b) by 632 days.

(21) Appl. No.: 18/187,701

(22) Filed: Mar. 22, 2023

(65) Prior Publication Data

US 2023/0341496 A1 Oct. 26, 2023

(30) Foreign Application Priority Data

Apr. 21, 2022 (DE) .......................... 102022109623.8

(51) Int. Cl.
*G01R 35/00* (2006.01)
*G01R 31/3842* (2019.01)
*G01R 31/396* (2019.01)

(52) U.S. Cl.
CPC ....... *G01R 35/005* (2013.01); *G01R 31/3842* (2019.01); *G01R 31/396* (2019.01)

(58) Field of Classification Search
CPC .. G01R 35/005; G01R 35/02; G01R 31/3842; G01R 31/396; G01R 31/367
See application file for complete search history.

(56) References Cited

U.S. PATENT DOCUMENTS

| | | | | |
|---|---|---|---|---|
| 2014/0084846 A1* | 3/2014 | Berkowitz | ............ | H02J 7/0071 |
| | | | | 320/141 |
| 2019/0366849 A1 | 12/2019 | Pennisi et al. | | |
| 2023/0268746 A1* | 8/2023 | Kang | .................. | H01M 10/482 |
| | | | | 307/116 |

FOREIGN PATENT DOCUMENTS

| | | | | | |
|---|---|---|---|---|---|
| CN | 110562091 A | * | 12/2019 | .............. | B60L 53/62 |
| DE | 102017212966 A1 | * | 1/2019 | ......... | H01M 10/482 |
| DE | 102020124737 A1 | * | 3/2022 | ............ | H01M 10/48 |
| JP | 2012047715 A | * | 3/2012 | ............. | G01R 31/36 |

* cited by examiner

*Primary Examiner* — Lal Ce Mang
(74) *Attorney, Agent, or Firm* — Leydig, Voit & Mayer, Ltd.

(57) ABSTRACT

High-voltage electronics have a plurality of electronics modules connected in series between terminals of the high-voltage electronics. A system for calibrating the high-voltage electronics includes: a plurality of controllable module switches, wherein for each respective electronics module of the plurality of electronics modules, a respective controllable module switch is configured to shunt the respective electronics module by its closing. The plurality of controllable module switches are configured to be actuated such that: in a first state of the plurality of controllable module switches, no electronics modules are connected to the terminals; in a second state of the plurality of controllable module switches, one electronics module is connected to the terminals; and in a third state of the plurality of controllable module switches, multiple electronics modules are connected to the terminals.

11 Claims, 7 Drawing Sheets

ARRANGEMENT AND METHOD FOR CALIBRATING HIGH-VOLTAGE ELECTRONICS

CROSS-REFERENCE TO PRIOR APPLICATIONS

Priority is claimed to German Patent Application No. DE 102022109623.8, filed on Apr. 21, 2022, the entire disclosure of which is hereby incorporated by reference herein.

FIELD

The application relates to an arrangement and a method for calibrating high-voltage electronics. The high-voltage electronics have terminals and several electronics modules connected in series between the terminals.

BACKGROUND

High-voltage electronics with electronics modules connected in series may be used, for example, for emulating high-voltage batteries having several cells connected in series—the battery cells. High-voltage batteries—in particular, for automotive applications—can provide DC voltages in a range up to approximately 800 V.

For the application, e.g., in vehicles, an electronic unit, which is referred to as a battery management system, can monitor the state of charge of individual cells of an actual high-voltage battery and, if necessary, correct this so that all cells have a charging state that is as equal as possible. In order to develop and test these battery management systems, hardware-in-the-loop systems can be used. These can electrically simulate the individual battery cells and the entire high-voltage battery via emulated high-voltage batteries, so that the battery management system receives virtually the same voltages and currents as in the design with the actual high-voltage battery.

The calibration of high-voltage electronics can be done, for example, using a calibration standard. The calibration standard may be, for example, a highly accurate measuring device, via which physical variables made available, for example, by the high-voltage electronics can be measured.

Electromechanical switches installed in the switching device can be provided for switching devices that can be connected to high-voltage electronics—for example, for external connection to a calibration standard. These switches must have a high, permanent dielectric strength, a high insulation resistance, and a sufficiently high current-carrying capacity. These demands require electromechanical switches of large dimensions and a high component price.

SUMMARY

In an exemplary embodiment, the present invention provides a system for calibrating high-voltage electronics, wherein the high-voltage electronics have a plurality of electronics modules connected in series between terminals of the high-voltage electronics. The system comprises: a plurality of controllable module switches, wherein for each respective electronics module of the plurality of electronics modules, a respective controllable module switch is configured to shunt the respective electronics module by its closing. The plurality of controllable module switches are configured to be actuated such that: in a first state of the plurality of controllable module switches, no electronics modules are connected to the terminals; in a second state of the plurality of controllable module switches, one electronics module is connected to the terminals; and in a third state of the plurality of controllable module switches, multiple electronics modules are connected to the terminals.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

In the figures, the same reference signs are used for the same or similar elements.

DESCRIPTION OF THE FIGURES

Figure 1:
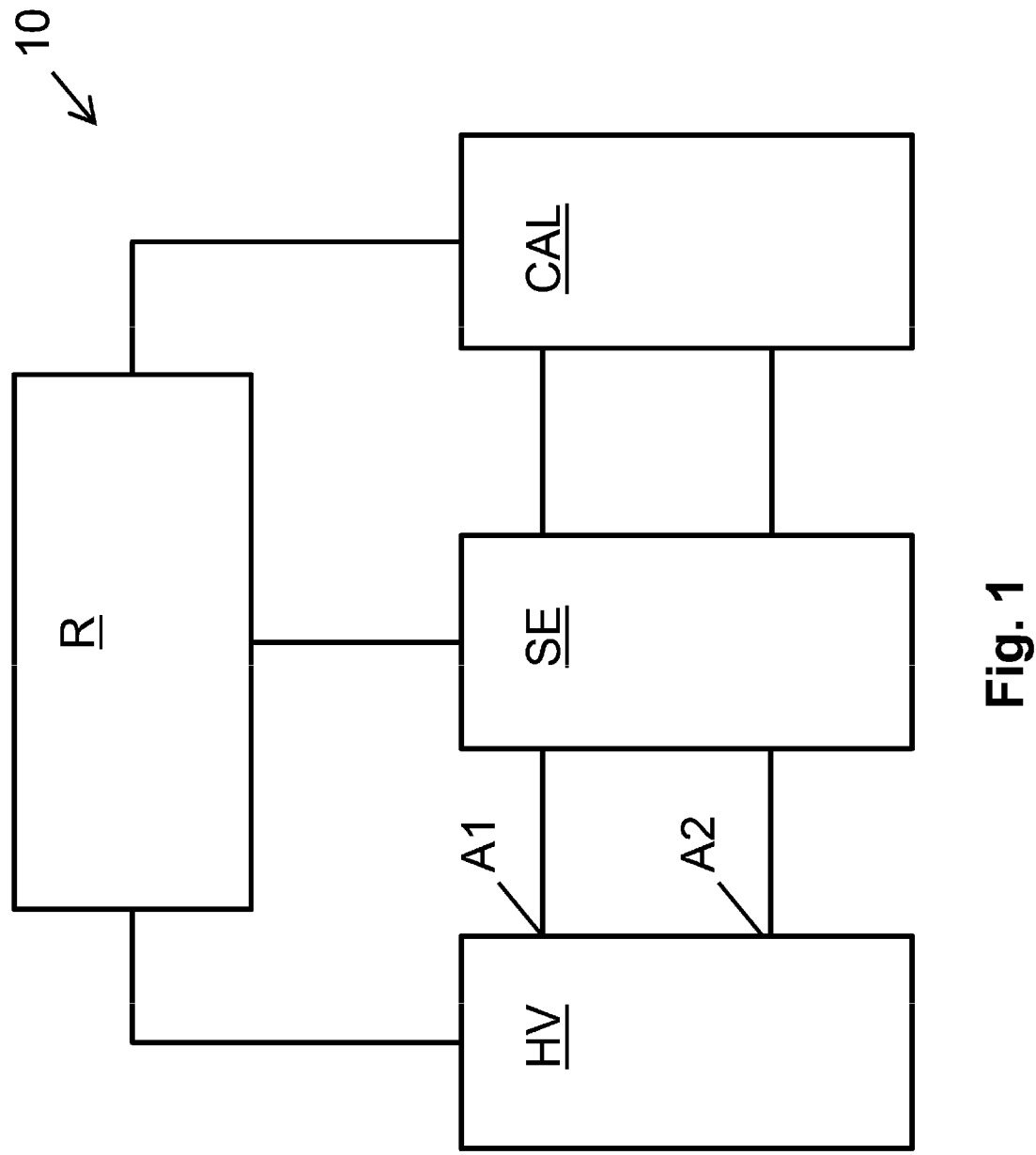
FIG. 1 schematically shows an arrangement for calibrating high-voltage electronics.

Exemplary embodiments of the application provide an arrangement or a method for calibrating high-voltage electronics which improves the calibration process.

In an arrangement for calibrating high-voltage electronics, the high-voltage electronics have several electronics modules connected in series between terminals. For each electronics module, a controllable module switch is provided which shunts the respective electronics module by its closing, so that, by suitable actuation of the module switches, no electronics modules, one electronics module, or several electronics modules can be connected to the terminals.

The connectivity is an electrical connectivity. The electronics modules can be electrically connected to the terminals by suitable actuation of the module switches. An electronics module is, in this arrangement, then electrically connected to the terminals when its assigned module switch is opened. If the assigned module switch is closed, the electronics module is shunted, i.e., short-circuited via the closed module switch. In the shunted state, the function for which the electronics module is provided is therefore not made available to the terminals.

Via the arrangement, it is possible, by actuation of the module switches, to set which of the electronics modules can be connected to the terminals, and thus can provide their electrical function via the terminals, and which can be electrically accessed via the terminals. The switching takes place within the high-voltage electronics. Short circuit switches of the electronics modules, which are controllable, can preferably be used as module switches.

In one embodiment of the arrangement, the electronics modules connected to the terminals are calibrated via the terminals of the high-voltage electronics. The electronics modules electrically connected to the terminals of the high-voltage electronics are accessible, for electrical calibration, from outside the high-voltage electronics via the terminals of the high-voltage electronics.

As a result of the switchability of the electrical connection of one or more electronics modules to the terminals within the high-voltage electronics, no electronics modules, one electronics module, or several electronics modules may be electrically accessible via the terminals by actuating the module switches, which makes possible, for example, an easy calibration at the module level. It is thus possible to calibrate individual electronics modules—in particular, to calibrate them regularly in order to check the precise compliance with the electrical properties, e.g., in the case of battery cells for ISO 26262, to check the accuracy of the cell voltage—for example, via a calibration standard.

In one embodiment, the high-voltage electronics have two terminals, between which the electronics modules connected in series are arranged. For calibration, terminals of a calibration standard can be connected to the terminals of the high-voltage electronics.

The arrangement enables for this purpose the use of a single calibration standard for an adjustable number of electronics modules. In particular, the use of a calibration standard for the calibration of exactly one electronics module can be realized easily. One after the other, further individual electronics modules can, by switching the module switches, be connected to the terminals and calibrated. By providing the controllable module switches in the high-voltage electronics, the respective electronics modules can be connected within the high-voltage electronics to the terminals, which can serve as a basis, for example, for automated calibration solutions of high-voltage electronics. The use of the module switches for switching between the electronics modules also avoids problems of an external HV switching device, for example, which can be provided for this purpose—for example, with regard to the mechanical integration and the associated costs. A cost and space reduction can thereby be achieved.

In one embodiment of the arrangement, a switching device is provided via which the high-voltage electronics can be connected to the calibration standard. The switching device has two connection switches via which a terminal of the high-voltage electronics can be connected to one terminal of the calibration standard in each case. Via the switching device, the connection of the calibration standard to the terminals of the high-voltage electronics can thus be configured to be switchable.

In one embodiment of the arrangement, the connection switches and/or the module switches may be electromechanical switches or semiconductor switches. In both embodiments, the switches can each be controlled by suitable control circuits. The control circuits may be part of the high-voltage electronics and in particular part of the circuitry of the high-voltage electronics.

In one embodiment of the arrangement, the high-voltage electronics system is a battery emulator configured to emulate a high-voltage battery having several cells connected in series and to provide an electrical voltage at the terminals, wherein the emulated cells are the electronics modules. In this case, each of the emulated cells can provide a cell voltage which is added by the series connection of the cells.

Each of the cells can further provide a cell current if, for example, a load is connected to the terminals of the battery emulator.

For calibration, each cell of the battery emulator can be connected to the calibration standard in succession and then be checked as to whether a cell voltage measured on the cell and/or a cell current measured on the cell matches the values measured by the calibration standard. In this case, high accuracy in the $\mu V$ or $\mu A$ range places corresponding demands on the calibration. The arrangement offers the advantage that the module switches within the high-voltage battery are accessed for switching between the cells. The module switches are configured to switch voltages within the range of a cell voltage. Switching in the high-voltage range can be dispensed with for the module switches.

The emulated cells of the battery emulator can thus be regularly calibrated in a simple manner in order to check, via the calibration standard, the precise compliance with the electrical properties (for example, for ISO 26262, the accuracy of the cell voltage).

In one embodiment of the arrangement, a module voltage meter and/or a module current meter is assigned to each of the cells. The measurement of the cell voltage and/or the cell current, e.g., during the calibration process, can then be carried out via the provided module voltage meter and/or module current meter.

In one embodiment, the arrangement is configured to measure the voltage, provided by the respective cells to be calibrated, via the respective module voltage meters of the cells to be calibrated and via the calibration standard, and to make the measured values available for a calibration. For the calibration, the two measured values can be compared and checked for as great a correspondence as possible. The provision can be made, for example, via display on a display device, where the values can then be compared by, for example, a person. Other evaluations, e.g., via image acquisition and computer-assisted evaluation of the image data, may also be implemented. Provision via a data interface to a computer may also be provided. A display can be done via the computer, and/or a computing unit of the computer can carry out the calibration process in an automated manner, for example.

In one embodiment, the arrangement is configured to impress a constant measurement current on the battery emulator via the calibration standard and to make the current measured by the respective module current meters of the cells to be calibrated available for a calibration. For the calibration, the two measured values can be compared and checked for as great a correspondence as possible. The provision can, for example, be made as previously described for the voltage measurement.

In one embodiment of the arrangement, the electronics modules are each electricity meters. Particularly when the high-voltage electronics are multichannel electronics, the electronics modules may be, for example, smart electricity meters, e.g., for 3-phase low-voltage networks, which are configured to measure phase alternating voltages and/or phase alternating currents. The arrangement can be used here for calibrating the measuring devices for the phase voltages and/or phase currents. Low voltage networks are part of the power grid for distributing the electrical power to the majority of the electrical end consumers (low-voltage devices). 3-phase low-voltage networks are usually operated at a mains voltage of 400 V to 1,000 V AC voltage.

In a method for calibrating high-voltage electronics which have several electronics modules connected in series between terminals of the high-voltage electronics, a controllable module switch is provided for each electronics module, which module switch shunts the respective electronics module by its closing. By suitably actuating the module switches, no electronics modules, one electronics module, or several electronics modules are electrically connected to the terminals.

In one embodiment of the method, the electronics modules to be calibrated are connected to the terminals.

In one embodiment, the high-voltage electronics have two terminals via which, for calibration, a first terminal of a calibration standard is connected to the first electronics module and a second terminal of the calibration standard to the last electronics module, wherein the calibration standard is connected to the terminals in particular via a switching device.

In one embodiment of the method, a battery emulator is used as the high-voltage electronics, which battery emulator emulates a high-voltage battery having several cells connected in series, wherein the cells are used as the electronics modules.

In one embodiment of the method, for calibrating module voltage meters, the voltage provided by each of the cells to be calibrated is measured by the respective module voltage meters of the cells to be calibrated and by the calibration standard, and the measurement values are made available for a calibration.

FIG. 1 shows an arrangement 10 for calibrating high-voltage electronics HV. The arrangement 10 has at least the high-voltage electronics HV with the terminals A1, A2. For calibration, the high-voltage electronics HV can be connected to a calibration standard CAL. Optionally, the arrangement 10 can have a switching device SE, via which the high-voltage electronics HV can be connected to the calibration standard CAL in a switchable manner. Furthermore, a computer R can be provided, for example, for controlling and/or detecting values of the high-voltage electronics HV and/or of the switching device SE and/or of the calibration standard CAL. The computer R can also be configured to receive data, e.g., from the calibration standard CAL. The computer can further have a user interface for input and output and may be, for example, a laptop, tablet, etc.

Figure 2:
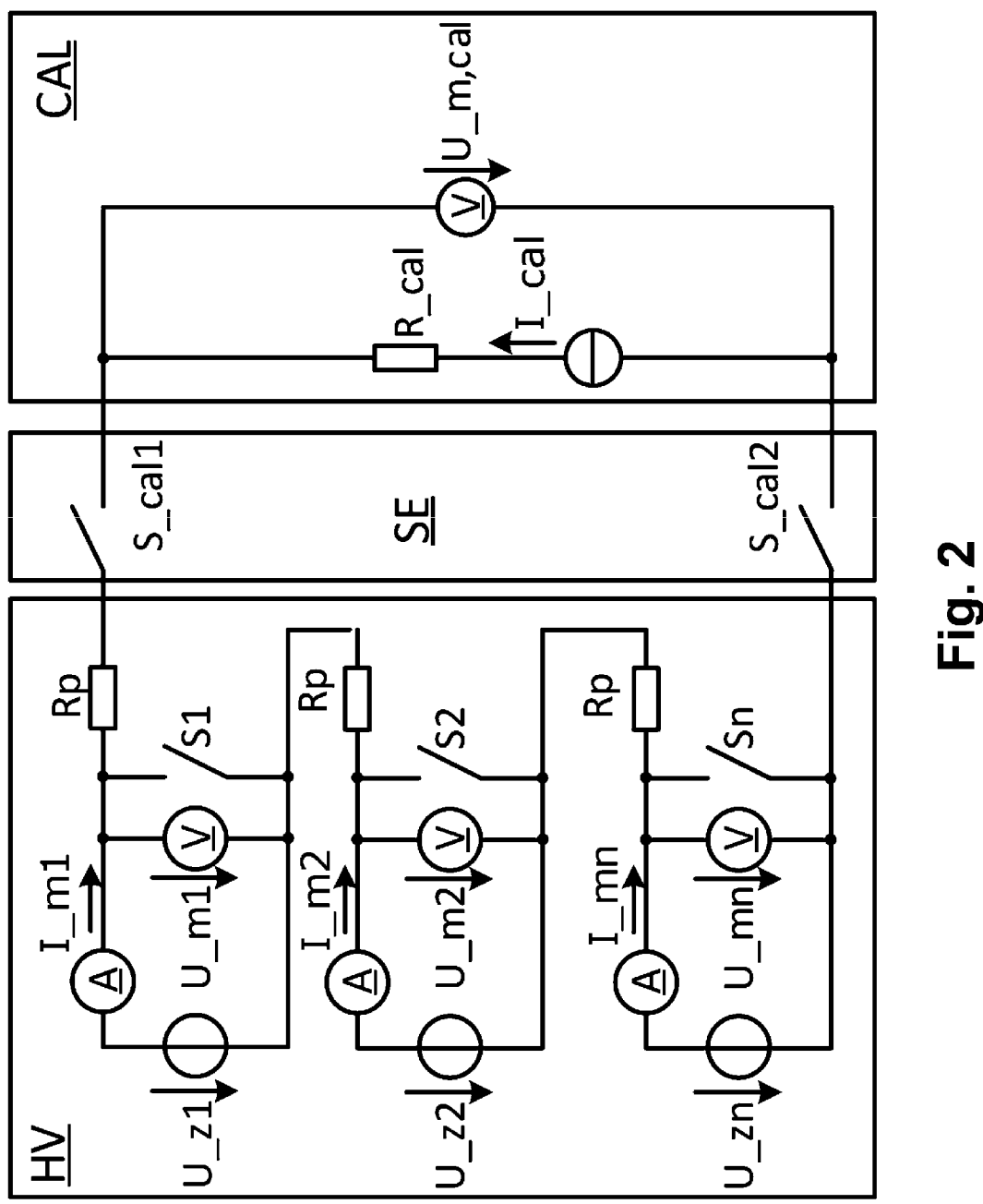
FIG. 2 is a schematic representation of the high-voltage electronics with switching unit and calibration standard in a first switching state.

FIG. 2 shows high-voltage electronics HV with switching unit SE and calibration standard CAL. The high-voltage electronics HV may be a battery emulator, and electronics modules of the high-voltage electronics HV may be cells. In the battery emulator HV, n cells are connected in series. Each cell includes a cell voltage source U_zi (with i=1, 2, . . . , n), a voltage measuring unit V, and a current measuring unit A. A particular voltage measuring unit V measures a respective measurement voltage U_m1, U_m2, . . . , U_mn. The calibration standard CAL has a high-precision voltage measuring device Vc. The optional power source Ic in the calibration standard is used to impress a constant measurement current I_cal in order to calibrate the current measuring units A of the cells with the respective measuring currents I_mi (with i=1, 2, . . . , n) (current return measurement).

To connect the battery emulator HV via the switching unit SE, the connection switches S_cal1, S_cal2 of the switching unit can be closed.

In the battery emulator HV, the simulated cells are connected in series as in an actual high-voltage battery. Module switches S1, S2, . . . , Sn are arranged in parallel to the simulated cells. The resistors Rp represent the parasitic ohmic components of the module switches Si (with i=1, 2, . . . , n).

By a suitable switching combination of the module switches S1, one or more simulated cells can be connected in series and linked to the calibration standard CAL, i.e., electrically connected via the terminals A1, A2.

Figure 3:
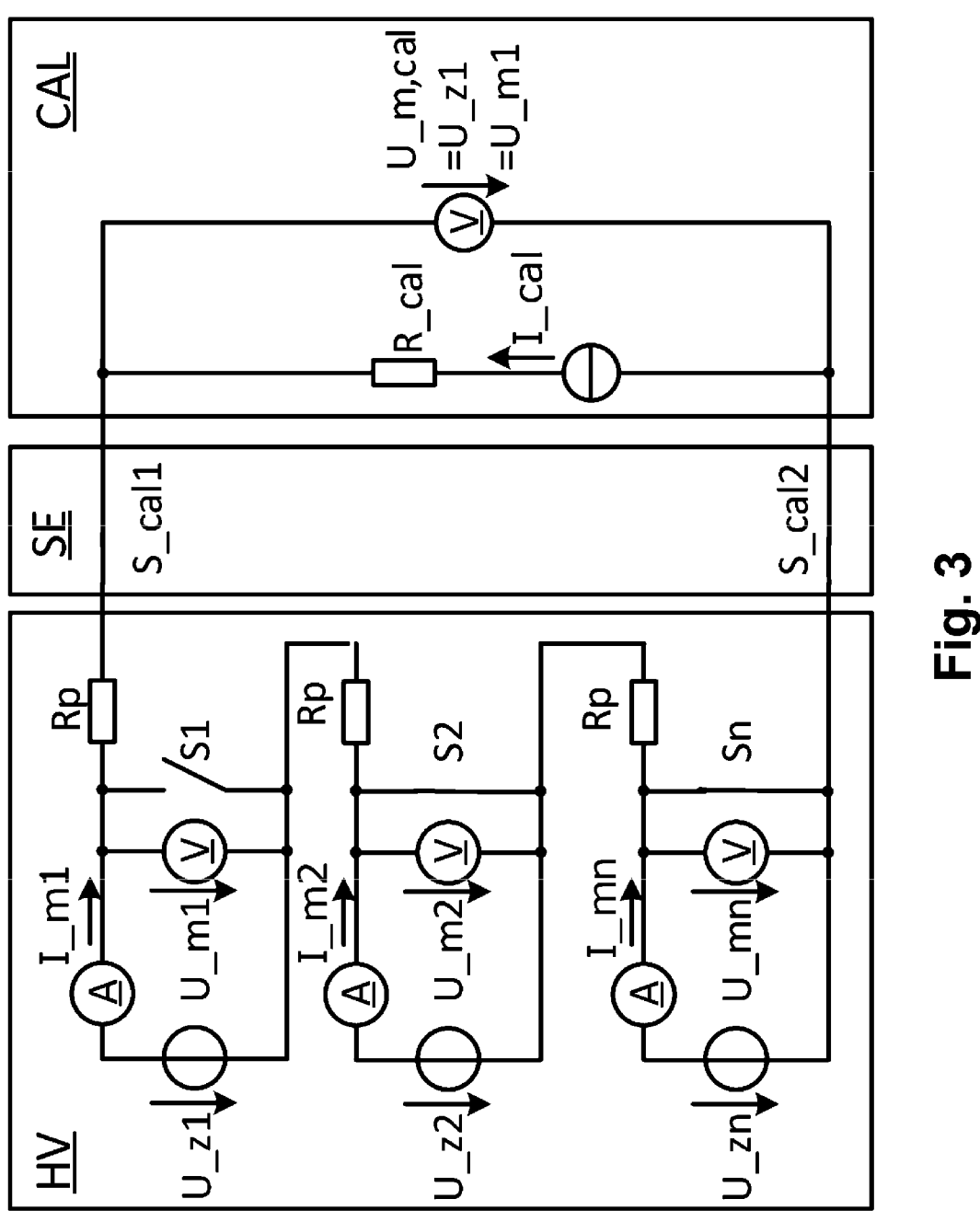
FIG. 3 is a schematic representation of the high-voltage electronics with switching unit and calibration standard in a second switching state.

FIG. 3 shows an example of a switching combination. For calibration of the first cell with the cell voltage U_z1, the module switches S2 through Sn and the connection switches S_cal1 and S_cal2 are closed; S1 remains open.

With this circuit of the module switches, the voltage U_z1 provided by the first cell, for example, can be calibrated by comparing the measurement voltage U_m1 to the voltage measured by the calibration standard. The following applies for a well-calibrated cell voltage of the first cell: U_m, cal=U_z1=U_m1.

Several cells can also be calibrated simultaneously, i.e., the sum of the voltages provided by several cells simultaneously. The cells, the dedicated module switch of which remains open, are taken into account in the series connection during the calibration. When several cells are connected in series, adjacent cells need not necessarily be connected. Individual cells can also be omitted. The cells whose assigned module switch remains open are taken into account in the calibration process.

Figure 4:
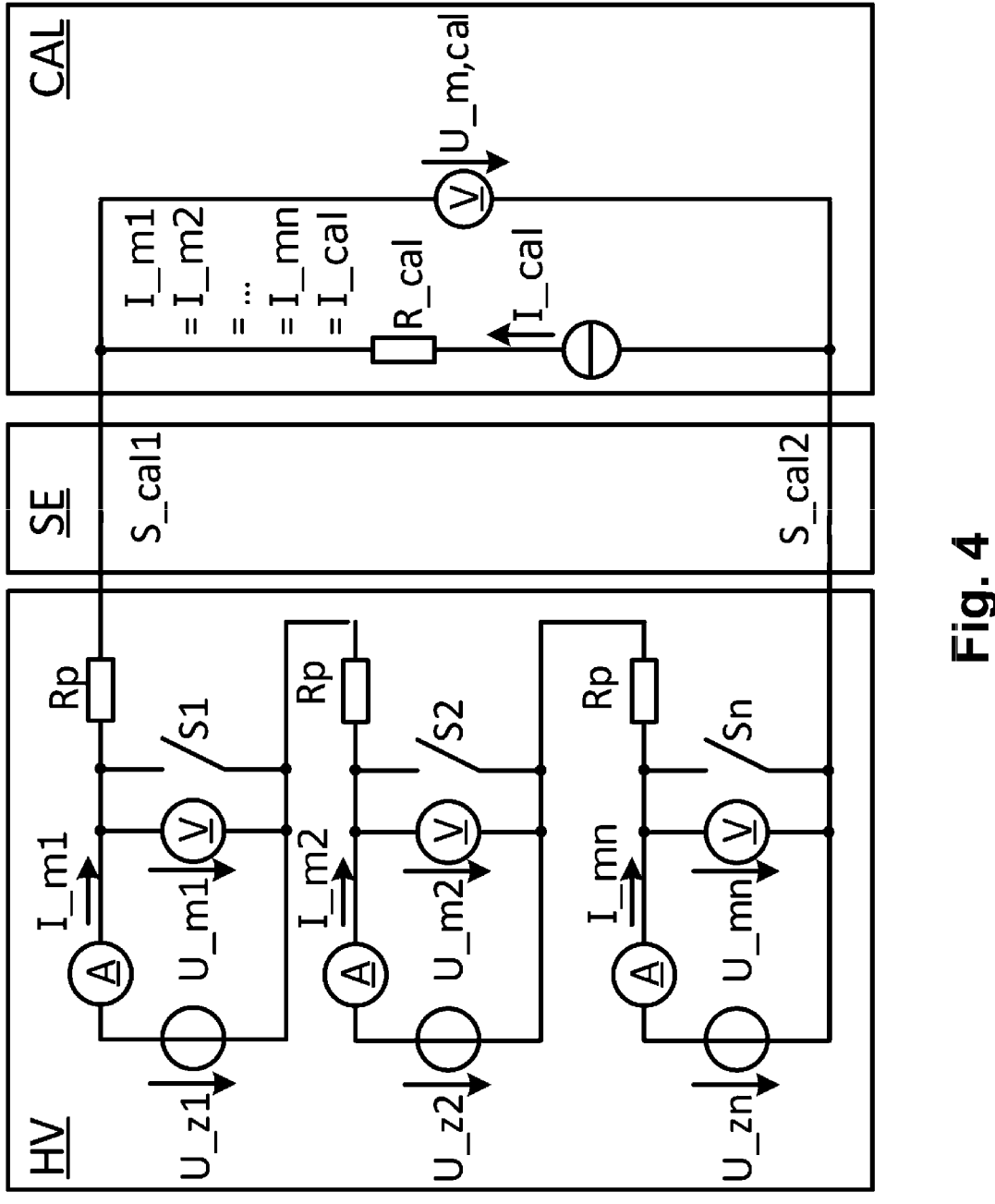
FIG. 4 is a schematic representation of the high-voltage electronics with switching unit and calibration standard in a third switching state.

FIG. 4 shows by way of example a switching combination for calibrating the current measurement of all cells. Calibration of the current measuring units can be done simultaneously for all cells by the switches S_cal1 and S_cal2 being closed and all module switches Si being opened, and a constant measurement current I_cal being impressed by the calibration standard CAL. For well-calibrated current meters, the following applies: I_m1=I_m2= . . . =I_mn=I_cal.

Instead of individual current meters A for each cell, a common current meter can also be provided which is connected in series with the cells.

The required permanent dielectric strength of the module switches Si is defined only by the maximum cell voltage U_zi,max that occurs during operation. It is of the same magnitude for all module switches Si. The battery emulator can thus be implemented with low-voltage switches as module switches Si and does not have to resort to expensive high-voltage switches of large dimensions. The number of module switches Si required is equal to the number of cells n. The switching unit SE with the connection switches S_cal1, S_cal2 is optional. In addition to the direct cost advantage, the smaller design enables a placement of the module switches directly as part of the cell voltage circuit as a component of the battery simulator. This enables efficient manufacture. The module switches, also, can be activated directly via the cell voltage switching. The module switches may be electromechanical switches, e.g., relays, or semiconductor switches. The control circuit may be a corresponding driver circuit, i.e., for example, for semiconductor switches, e.g., a gate driver circuit.

The module switches Si can be configured, for example, as a short-circuit switch (crowbar) for the cells, which—in the event of an overvoltage, i.e., for example, if the cell is charged with excessive voltage—short-circuit the cell in order not to destroy the battery emulator. Such short-circuit switches may be controllable in addition to their short-circuit safety function, and execute the described switching tasks for calibration, without additional switches having to be installed in the battery emulator. Only the connection switches S_cal1 and S_cal2 can, optionally, still be added. An automated calibration sequence can then also be realized via software for actuating the module switches Si. Such software can, for example, be executed on the computer R.

In contrast to pure short-circuit switches, the described module switches Si are configured and connected in such a way that they can be actively controlled and are not closed exclusively by overvoltage detection.

Figure 5:
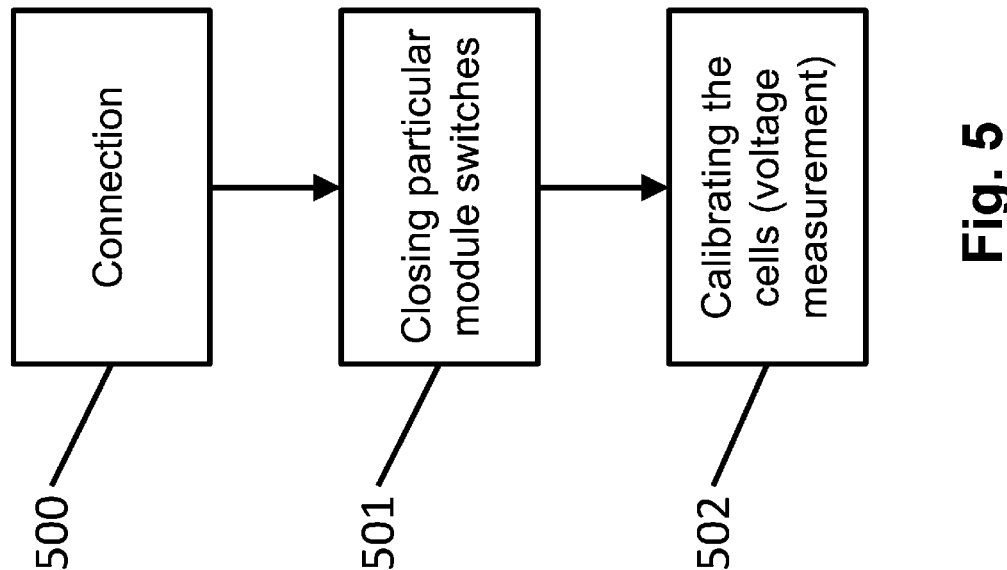
FIG. 5 shows an exemplary embodiment of a method for calibration.

FIG. 5 shows a method for calibrating voltmeters V. In step 500, the battery emulator is connected to the calibration standard by closing the connection switches S_cal1, S_cal2. To calibrate a respective cell with the cell voltage U_zi, all module switches except Si are, in step 501, closed; Si remains open. In step 502, the cell voltage U_zi of the i-th cell is then calibrated by measuring the voltage at the terminals of the battery emulator A1, A2 via the calibration standard CAL. For a well-calibrated cell, U_m, cal=U_zi=U_mi shall apply. FIG. 3 shows by way of example a switching combination of the battery emulator HV, with which the voltage calibration of the first cell can be carried out.

In the described methods for calibration, the parasitic resistors Rp have only a small influence, or even no influence. In the calibration of the voltage measurement, virtually no current flows, which is why there are no disruptive voltage drops across the parasitic resistors Rp, or they are very low. In the calibration of the current measurement, a constant direct current I_cal is impressed, which likewise flows independently of the parasitic resistors Rp.

Figure 6:
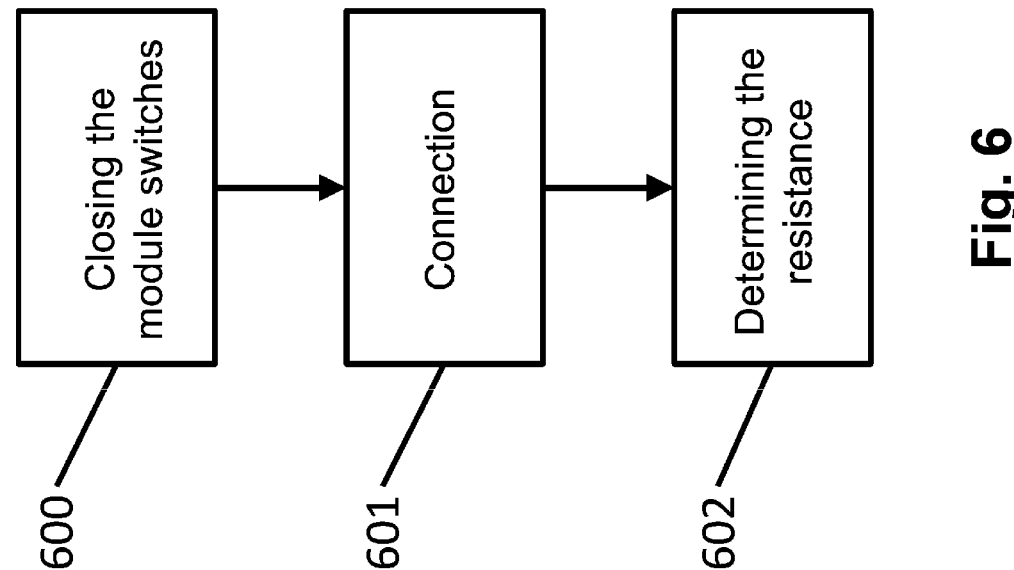
FIG. 6 shows a further exemplary embodiment of a method for calibration.

Should the parasitic resistors Rp lead to deviations in other calibration applications, e.g., in the case of calibration of the current measurement without externally-impressed direct current I_cal, the influence of the parasitic resistances can, via short-circuit measurement—all short-circuit switches closed—be identified and subsequently calculated out. FIG. 6 shows such a method for short-circuit measurement. In step 600, all module switches Si are closed, and all cells are thus short-circuited. In step 601, the battery emulator HV is connected to the calibration standard, and, in step 602, the influence of the parasitic resistors Rp, i.e., in the example shown, the sum of the resistors Rp, is determined by current and voltage measurement via the calibration standard CAL.

Figure 7:
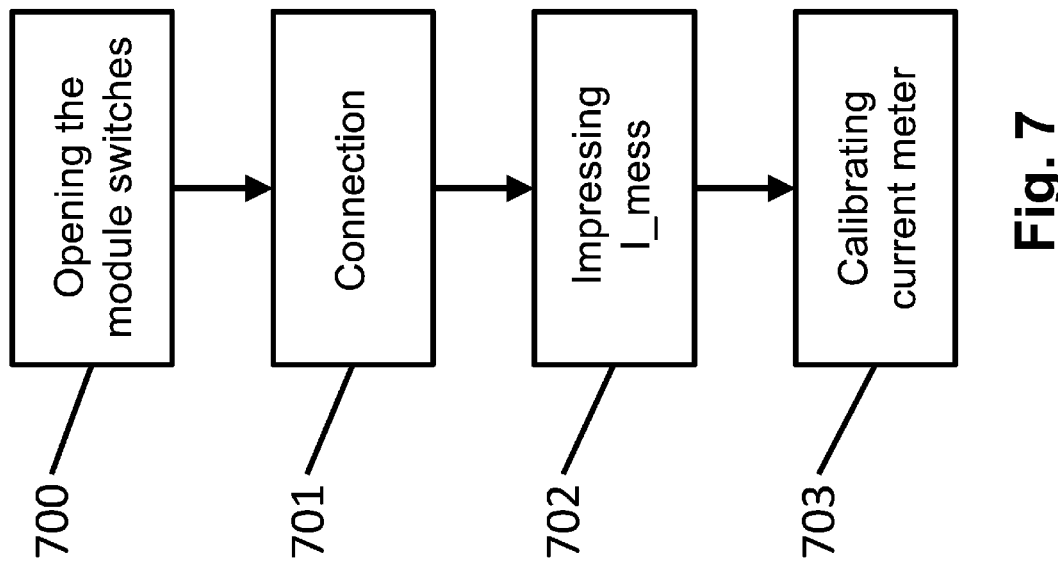
FIG. 7 shows a further exemplary embodiment of a method for calibration.

FIG. 7 shows a method for calibrating the current measurement of all cells. In step 700, all module switches Si are opened. In step 701, the battery emulator is connected to the calibration standard by closing the connection switches S_cal1, S_cal2. In step 702, a constant measurement current I_cal is impressed by the calibration standard CAL. In step 703, the measurement current I_cal is compared to the measured cell currents I_mi, and the battery emulator is thereby calibrated. For well-calibrated current meters, the following applies: I_m1=I_m2= . . . =I_mn=I_cal. Alternatively, only one current meter A, which is connected in series with the cells, can also be provided in the battery emulator HV.

This approach therefore lays out the basis for an automated calibration of all cells and only manages to work with low voltage switches as module switches Si. If the individual cells are protected by short-circuit switches, they can be used as module switches Si for calibration, without additional switches having to be installed. This results in a significant reduction in costs and space.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

10 Calibration arrangement
A1, A2 Terminals
R Computing unit
HV High-voltage electronics
SE Switching unit
CAL Calibration standard
S1, S2, . . . , Sn Module switch
Rp Resistance switch
S_cal1, S_cal2 Connection Switch
U_z1, U_z2, . . . , U_zn Cell voltage
I_m1, I_m2, . . . , I_mn Measurement current
U_m1, U_m2, . . . , U_mn Measurement voltage
U_m,cal Voltage calibration standard
I_cal Current calibration standard
R_cal Resistance calibration standard
A Module current meter
V Module voltage meter
Ic Power source calibration standard
Vc Voltage meter calibration standard
500, . . . , 703 Method steps

The invention claimed is:

1. A system for calibrating high-voltage electronics, wherein the high-voltage electronics have a plurality of electronics modules connected in series between terminals of the high-voltage electronics, wherein the system comprises:

a plurality of controllable module switches, wherein for each respective electronics module of the plurality of electronics modules, a respective controllable module switch is configured to shunt the respective electronics module by its closing;

wherein the plurality of controllable module switches are configured to be actuated such that:

in a first state of the plurality of controllable module switches, no electronics modules are connected to the terminals;

in a second state of the plurality of controllable module switches, one electronics module is connected to the terminals; and in a third state of the plurality of controllable module switches, multiple electronics modules are connected to the terminals;

wherein the high-voltage electronics comprise a battery emulator configured to emulate a high-voltage battery with cells connected in series and to provide a voltage at the terminals of the high-voltage electronics, wherein the cells are the electronics modules:

wherein module current meters are assigned to the cells; and wherein the system is configured to impress a constant measurement current on the battery emulator via a calibration standard and to make a current measured by a respective module current meter available for calibration.

2. The system according to claim 1, wherein the plurality of electronics modules are configured to be calibrated via the terminals.

3. The system according to claim 1, wherein the plurality of electronics modules are configured to be calibrated via the calibration standard, wherein the calibration standard has terminals connected to the terminals of the high-voltage electronics.

4. The system according to claim 3, further comprising: a switching device via which the high-voltage electronics are connectable to the calibration standard, wherein the switching device has two connection switches via which respective terminals of the high-voltage electronics are connectable to respective terminals of the calibration standard.

5. The system according to claim 4, wherein the connection switches and/or the controllable module switches are electromechanical switches or semiconductor switches.

6. The system according to claim 1, wherein module voltage meters are further assigned to the cells.

7. The system according to claim 6, wherein the system is further configured to measure a voltage provided by respective cells to be calibrated, via respective module voltage meters of the cells to be calibrated and via the calibration standard, and to make the measured voltage available for calibration.

8. A method for calibrating high-voltage electronics which have a plurality of electronics modules connected in series between terminals of the high-voltage electronics, wherein the method comprises:

providing, for each respective electronics module of the plurality of electronics modules, a respective controllable module switch; and shunting one or more respective electronics modules by closing one or more respective controllable module switches, wherein, based on the shunting, no electronics modules, one electronics module, or multiple electronics modules are connected to the terminals of the high-voltage electronics;

wherein the high-voltage electronics comprise a battery emulator which emulates a high-voltage battery having several cells connected in series, wherein the cells are the electronics modules; and wherein, for calibration of module voltage meters, a voltage provided by each of a plurality of to-be-calibrated cells is measured by a respective module voltage meter and by a calibration standard, and the measured voltages are made available for calibration.

9. The method according to claim 8, further comprising: connecting to-be-calibrated electronics modules to the terminals of the high-voltage electronics.

10. The method according to claim 8, further comprising: for calibration, connecting a first terminal of the calibration standard to a first electronics module and a second terminal of the calibration standard to a last electronics module.

11. The method according to claim 10, wherein the connection is made via a switching device.

* * * * *